(12) United States Patent
Kamgaing et al.

(10) Patent No.: US 12,327,794 B2
(45) Date of Patent: Jun. 10, 2025

(54) DIE COUPLING USING A SUBSTRATE WITH A GLASS CORE

(71) Applicant: Intel Corporation, Santa Clara, CA (US)

(72) Inventors: Telesphor Kamgaing, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 846 days.

(21) Appl. No.: 17/350,152

(22) Filed: Jun. 17, 2021

(65) Prior Publication Data

US 2022/0406721 A1 Dec. 22, 2022

(51) Int. Cl.
*H01L 23/538* (2006.01)
*H01L 21/48* (2006.01)
*H01L 23/00* (2006.01)
*H01L 23/15* (2006.01)
*H01L 23/48* (2006.01)
*H01L 23/498* (2006.01)
*H01L 25/065* (2023.01)

(52) U.S. Cl.
CPC ...... *H01L 23/5381* (2013.01); *H01L 21/4853* (2013.01); *H01L 21/4857* (2013.01); *H01L 21/486* (2013.01); *H01L 23/15* (2013.01); *H01L 23/481* (2013.01); *H01L 23/49816* (2013.01); *H01L 23/49822* (2013.01); *H01L 23/49833* (2013.01); *H01L 23/49838* (2013.01); *H01L 23/5385* (2013.01); *H01L 23/5386* (2013.01); *H01L 24/16* (2013.01); *H01L 25/0655* (2013.01); *H01L 2224/16235* (2013.01); *H01L 2924/14335* (2013.01); *H01L 2924/1436* (2013.01); *H01L 2924/1437* (2013.01)

(58) Field of Classification Search
CPC ..................................................... H01L 23/00
See application file for complete search history.

(56) References Cited

U.S. PATENT DOCUMENTS

2019/0229100 A1  7/2019  Im
2021/0028080 A1  1/2021  Pietambaram

FOREIGN PATENT DOCUMENTS

DE  102020116319  1/2021
EP  3554200  10/2019

OTHER PUBLICATIONS

Extended European Search Report for European Patent Application No. 22170162.6 mailed Oct. 18, 2022, 8 pgs.

*Primary Examiner* — Marvin Payen
(74) *Attorney, Agent, or Firm* — Schwabe, Williamson & Wyatt P.C.

(57) ABSTRACT

Embodiments described herein may be related to apparatuses, processes, and techniques related to via structures and/or planar structures within a glass core of a substrate to facilitate high-speed signaling with a die coupled with the substrate. In embodiments, the substrate may be coupled with an interposer to enable high-speed signaling between a compute die (or tile) and a storage die (or tile) that may be remote to the substrate. Other embodiments may be described and/or claimed.

17 Claims, 10 Drawing Sheets

DIE COUPLING USING A SUBSTRATE WITH A GLASS CORE

FIELD

Embodiments of the present disclosure generally relate to the field of semiconductor packaging, and in particular to die coupling.

BACKGROUND

Continued growth in virtual machines and cloud computing will continue to increase the demand for high-speed I/O between packages and substrates.

DETAILED DESCRIPTION

Embodiments described herein may be related to apparatuses, processes, and/or techniques for using through via structures and/or planar structures within a glass core of a substrate to facilitate high-speed signaling with a die coupled with the substrate. In embodiments, the substrate may be coupled with an interposer. Example embodiments may include a glass core substrate to enable high-speed signaling between a compute die (or tile) and a storage die (or tile) that may be remote to the substrate.

Continuous demand to include more dies within a package or a platform has led to silicon tiling, which may be referred to as active die tiling. Legacy approaches currently available include die stacking for close proximity or two-dimensional (2D) addition, for example dies that are tiled and assembled on a multilayer organic substrate with a copper clad laminate (CCL) core. Legacy implementations may have die tiles side-by-side, or may have different dies positioned next to each other. However, these legacy approaches lead to increased package form factor size.

Legacy approaches may also include three-dimensional (3D) die stacking or three dimensional integrated circuits (3DIC) to increase the die count without increasing the overall platform form factor size. These legacy approaches have challenges including complex thermal management and potential signal integrity issues from cross talk. In addition, increasing the package size may lead to low package yield, resulting from an increased form factor size, increased layer count and decreased return on investment for packaging fabrication. Legacy implementations may also have structural limitations to the frequency range of operation and the bandwidth density of components within a package. Additionally, legacy core technology limits the relative location of high-speed compute and storage dies, which in legacy implementations need to be in close proximity to each other to achieve high bandwidth. In legacy technologies, high-bandwidth density is generally achieved by having the high-speed dies assembled on the same side of the package substrate as the core PTH substantially reduce both the frequency range of operation and the density of vertical signal lines through the core.

Embodiments described herein may enable a package level platform architecture that uses package tiling, as well as planes and vias in a glass core, to improve vertical transitions within a package to increase bandwidth and/or frequency. These embodiments enable flexible package architecture and may improve package yield. The result of embodiments may reduce package sizes, which may facilitate a higher yield on a package substrate. In addition, embodiments may provide memory pooling to optimize use of computing and storage resources that are not close to each other within a package.

Processes for creating vias and/or planes within a glass substrate are also described herein. In embodiments, one or more laser sources followed by wet-etching may be used to create through hole vias or trenches, which may be referred to as planes, into the glass panel or glass wafer. Using these laser techniques, vias may be created with a small diameter, for example on the order of less than 10 μm, and may be spaced with a pitch on the order of 50 μm or less. Other vias may be created with different diameter sizes. These vias may be later plated or filled to create electrical pathways through the bridge. These techniques may be used to create vias in the glass wafer or panel that have high aspect ratios, for example 40:1 or 50:1. Because of the fine pitch of the vias, more signals may be put through the ball grid array (BGA) field and the substate core at a higher density and may expand the frequency range resulting in higher bandwidth communications. In addition, these techniques may reduce or eliminate impedance mismatch, which in legacy implementations may limit the frequency bandwidth of signals transmitted through the package BGA interface.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Figure 1A:
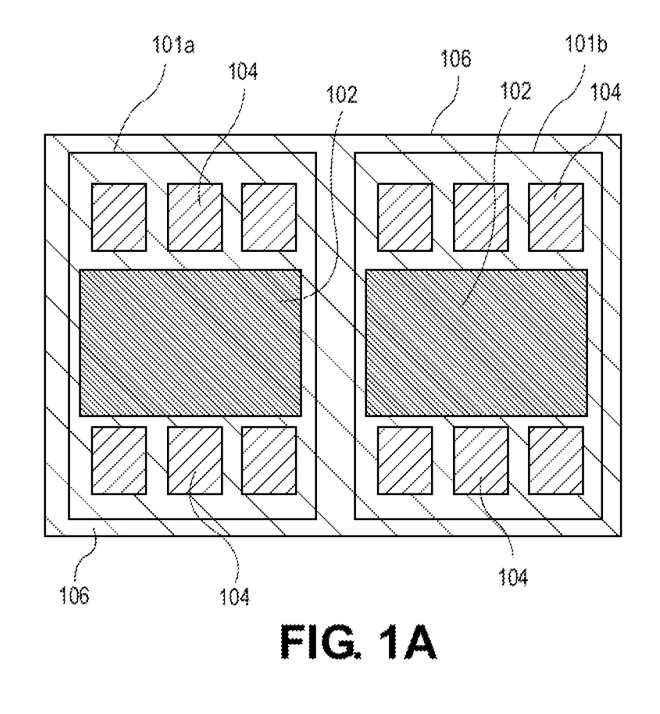
FIGS. 1A-1B show examples of legacy packages with multi-tile architectures that include compute tiles and storage tiles.
Figure 1B:
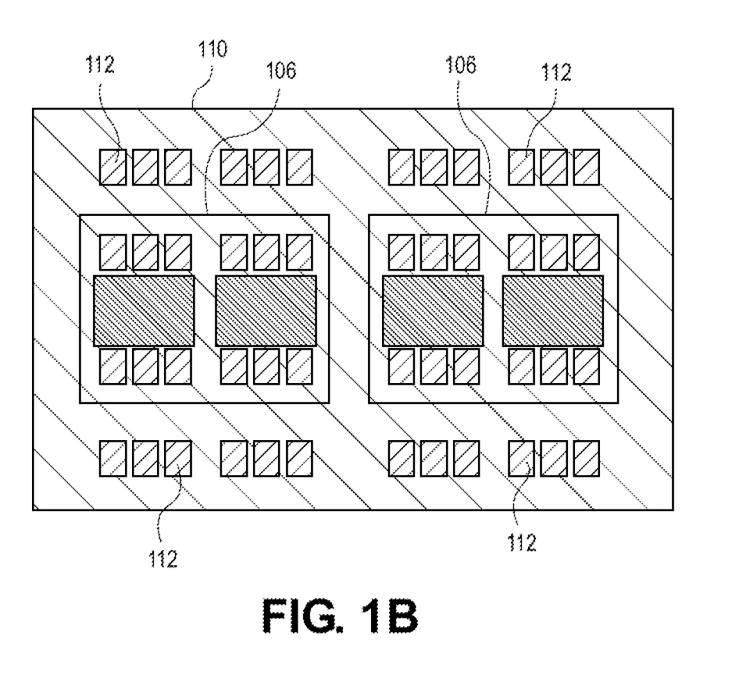

FIGS. 1A-1B show examples of legacy packages with multi-tile architectures that include compute tiles and storage tiles. FIG. 1A illustrates a conceptual drawing of a two tile 101a, 101b architecture that includes one or more compute die complexes 102, that may be surrounded by one or more co-packaged storage dies 104. The one or more compute die complexes 102 and the one or more co-packaged storage dies 104 that make up a tile 101a, 101b, may all be within a package 106. In this way, the co-packaged storage dies 104 are in close proximity to their associated compute tiles 102, which are typically on the same tile 101a, 101b, to provide high-speed communication. In embodiments, bridges (not shown) between the compute tiles 102 in the co-packaged storage dies 104 may provide electrical coupling. In embodiments, these bridges may include an embedded multi-die interconnect bridge (EMIB) or an omnidirectional interconnect (ODI) or a high-density on-package interconnect.

FIG. 1B illustrates a multi-tile architecture within a package 110, that may include one or more instances of the layout within the package of FIG. 1A, which may be similar to package 106. However, interconnects may be needed for the second row dies 112 which, in implementations, may be additional storage dies or storage tiles, between the compute complex and dies (or die complex) 102 and the second row dies 112. Embodiments described herein are directed to architectures that use glass cores or glass substrates to enable glass-based packaging substrate technology to enable fine pitch vias and vertical planes and/or trenches within the core of a multilayer substrate to provide such interconnect structures and more.

Figure 2:
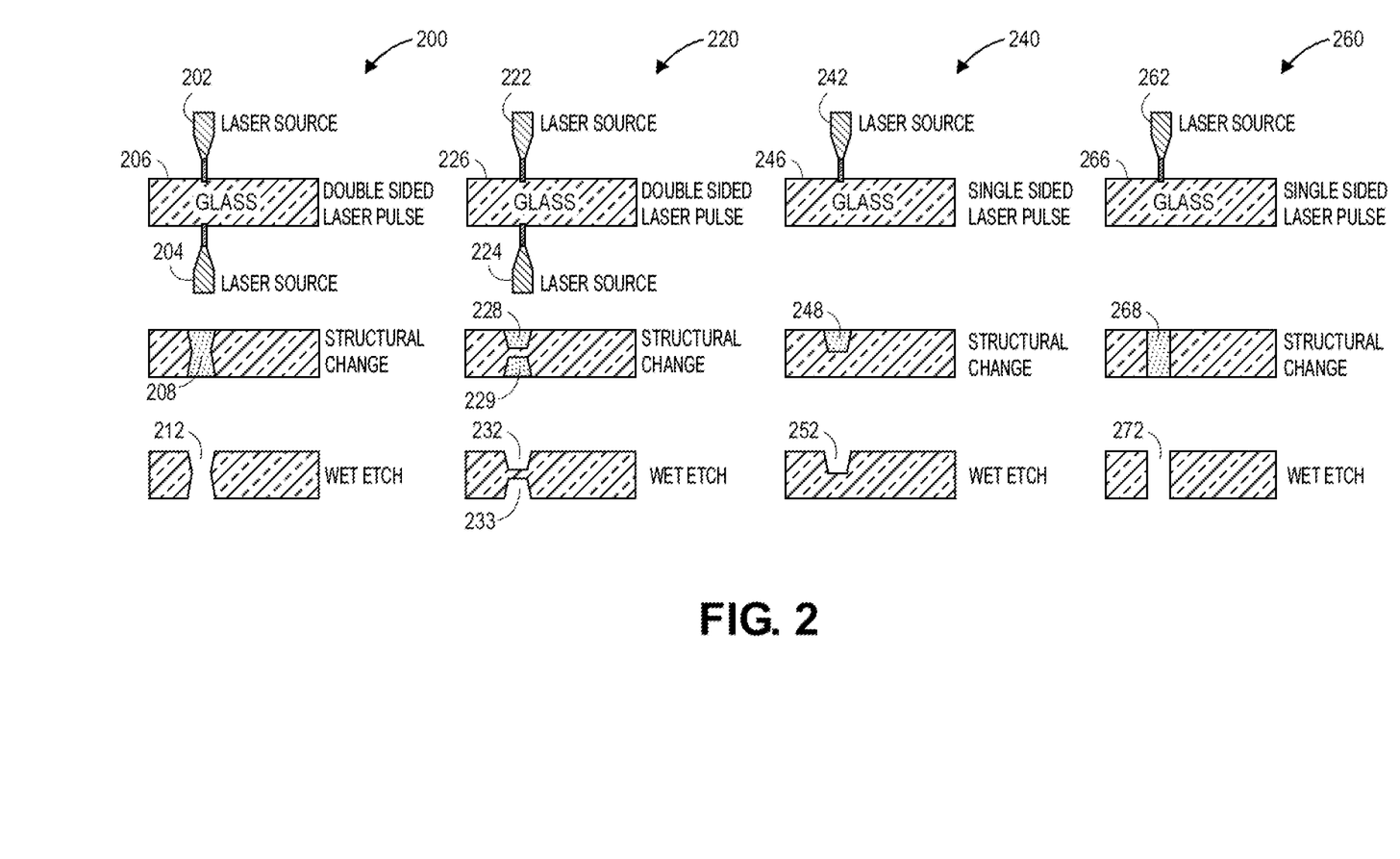
FIG. 2 illustrates multiple examples of laser-assisted etching of glass interconnects processes, in accordance with various embodiments.

FIG. 2 illustrates multiple examples of laser-assisted etching of glass interconnects processes (which may be referred to as "LEGIT" herein), in accordance with embodiments. One use of the LEGIT technique is to provide an alternative substrate core material to the legacy copper clad laminate (CCL) core used in semiconductor packages used to implement products such as servers, graphics, clients, 5G, and the like. By using laser-assisted etching, crack free, high density via drills, hollow shapes may be formed into a glass substrate. In embodiments, different process parameters may be adjusted to achieve drills of various shapes and depths, thus opening the door for innovative devices, architectures, processes, and designs in glass. Embodiments, such as the bridge discussed herein, may also take advantage of these techniques.

Diagram 200 shows a high level process flow for a through via and blind via (or trench) in a microelectronic package substrate (e.g. glass) using LEGIT to create a through via or a blind via. A resulting volume/shape of glass with laser-induced morphology change that can then be selectively etched to create a trench, a through hole or a void that can be filled with conductive material. A through via 212 is created by laser pulses from two laser sources 202, 204 on opposite sides of a glass wafer 206. As used herein, a through drill and a through via refers to when the drill or the via starts on one side of the glass/substrate and ends on the other side. A blind drill and a blind via refers to when the drill or the via starts on the surface of the substrate and stops half way inside the substrate. In embodiments, the laser pulses from the two laser sources 202, 204 are applied perpendicularly to the glass wafer 206 to induce a morphological change 208, which may also be referred to as a structural change, in the glass that encounters the laser pulses. This morphological change 208 includes changes in the molecular structure of the glass to make it easier to etch out (remove a portion of the glass). In embodiments, a wet etch process may be used.

Diagram 220 shows a high level process flow for a double blind shape. A double blind shape 232, 233 may be created by laser pulses from two laser sources 222, 224, which may be similar to laser sources 202, 204, that are on opposite sides of the glass wafer 226, which may be similar to glass wafer 206. In this example, adjustments may be made in the laser pulse energy and/or the laser pulse exposure time from the two laser sources 222, 224. As a result, morphological changes 228, 229 in the glass 226 may result, with these changes making it easier to etch out portions of the glass. In embodiments, a wet etch process may be used.

Diagram 240 shows a high level process flow for a single-blind shape, which may also be referred to as a trench. In this example, a single laser source 242 delivers a laser pulse to the glass wafer 246 to create a morphological change 248 in the glass 246. As described above, these morphological changes make it easier to etch out a portion of the glass 252. In embodiments, a wet etch process may be used.

Diagram 260 shows a high level process flow for a through via shape. In this example, a single laser source 262 applies a laser pulse to the glass 266 to create a morphological change 268 in the glass 266, with the change making it easier to etch out a portion of the glass 272. As shown here, the laser pulse energy and/or laser pulse exposure time from the laser source 262 has been adjusted to create an etched out portion 272 that extends entirely through the glass 266.

With respect to FIG. 2, although embodiments show laser sources 202, 204, 222, 224, 242, 262 as perpendicular to a surface of the glass 206, 226, 246, 266, in embodiments, the laser sources may be positioned at an angle to the surface of the glass, with pulse energy and/or pulse exposure time variations in order to cause a diagonal via or a trench, or to shape the via, such as 212, 272, for example to make it cylindrical, tapered, or include some other feature. In addition, varying the glass type may also cause different features within a via or a trench as the etching of glass is strongly dependent on the chemical composition of the glass.

In embodiments using the process described with respect to FIG. 2, through hole vias 212, 272 may be created that are less than 10 μm in diameter, and may have an aspect ratio of 40:1 to 50:1. As a result, a far higher density of vias may be placed within the glass and be placed closer to each other at a fine pitch. In embodiments, this pitch may be 50 μm or less. After creating the vias or trenches, a metallization process may be applied in order to create a conductive pathway through the vias or trenches, for example a plated through hole (PTH). Using these techniques, finer pitch vias will result in better signaling, allowing more I/O signals to be put through the glass wafer and to other coupled components such as a substrate.

Figure 3A:
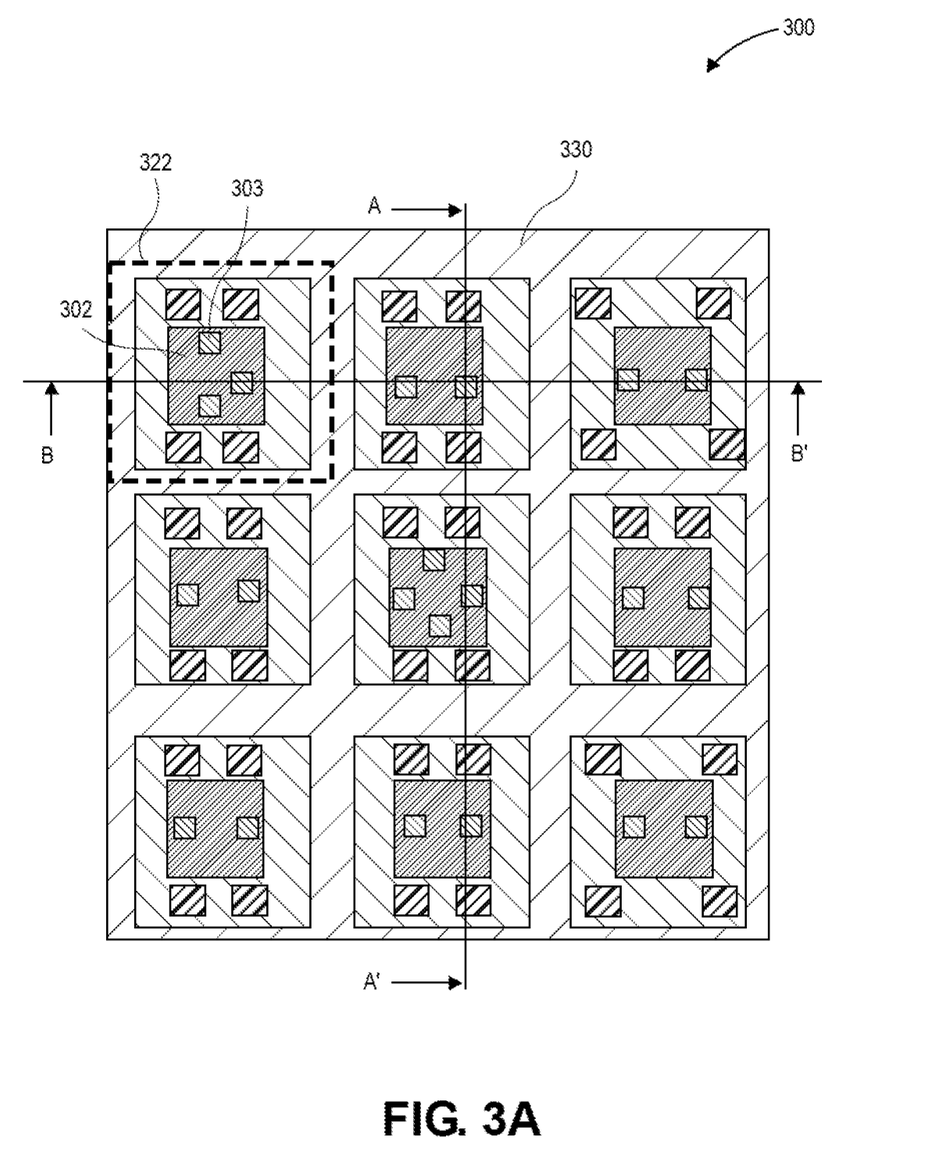
FIGS. 3A-3C illustrate a multi-patch that includes a glass core on an interposer, in accordance with various embodiments
Figure 3B:
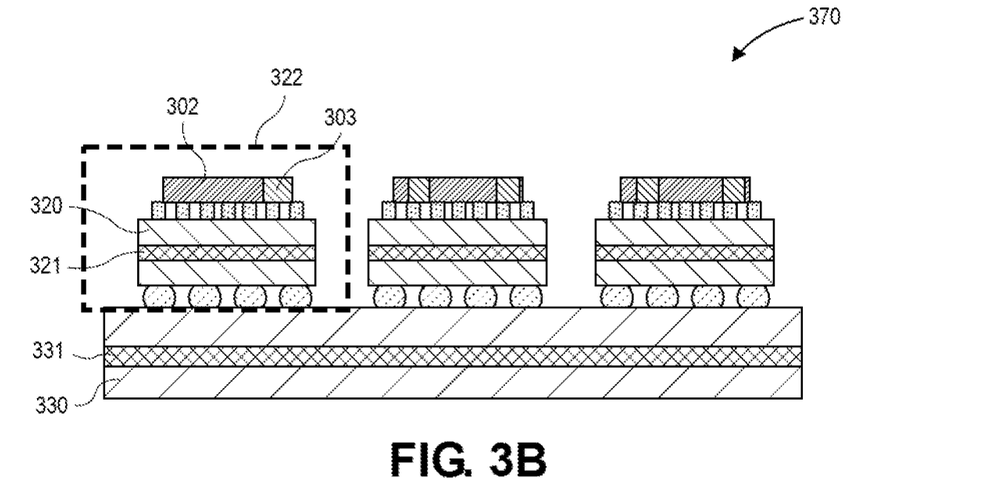
Figure 3C:
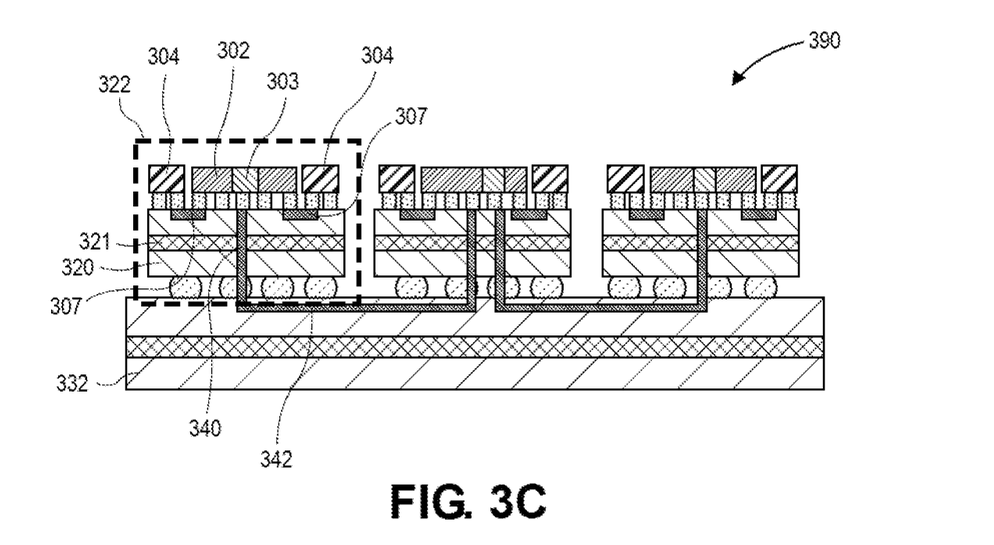

FIGS. 3A-3C illustrate a multi-patch that includes a glass core on an interposer, in accordance with various embodiments. Unlike legacy implementations of FIGS. 1A-1B, embodiments such as FIG. 3A illustrates a multi-patch embodiment that divides a package 300 into smaller lower layer count packages, which may be referred to as a package level tile 322, or may also be referred to as a patch. In embodiments as described further below, the package level tiles 322 may include a glass core, into which conductive structures such as those described with respect to FIG. 2, may be created.

In embodiments, the package level tiles 322 may be assembled on a large interposer 330. In embodiments, the package level tiles 322 may be interconnected through a printed circuit board (PCB) layer, or a layer within the interposer 330, due to the glass core within the package level tiles 322, as discussed further below.

FIG. 3B shows cross-section 370, which may be a cross-section corresponding to B-B' of FIG. 3A. The cross-section shows the interposer 330, which may include a core 331, which may be a glass core or a copper clad laminate (CCL) core. A package level tile 322 may be physically and electrically coupled to the interposer 330. The substrate 320 of the package level tile 332 includes a glass core 321, through which conductive structures electrically couple components of the die complex 302, for example a serializer/deserializer (SerDes) 303. In embodiments, the die complex 302 may be a Foveros die complex with multiple dies connected together, or the die complex 302 could be just a single die.

FIG. 3C shows cross-section 390, which may be a cross-section corresponding to the A-A' of FIG. 3A. The cross-section shows the interposer 332 to which a package level tile 322 is physically and electrically coupled. Die complex 302, which may include a SerDes component 303, is electrically and physically coupled to the substrate 320 of the package level tile 322. In embodiments, the substrate 320 includes a glass core 321 that includes one or more vias 340 through which high-speed communication links 342 may be routed. In embodiments, the vias 340 include vias through a buildup layer of the substrate 320, as well as vias through the glass core 321, which may be created using the techniques described above with respect to FIG. 2.

One or more co-package storage dies 304 may be electrically coupled with the die complex 302 using a bridge 307 to provide high-speed/high-bandwidth access. In embodiments, the co-packaged die may be a graphic die, a compute complex, or any other type of die. In embodiments, the bridge 307 may be an EMIB, an ODI, a zero misalignment via (ZMV), an on-package high-density interconnect or some other bridging technology.

Figure 4:
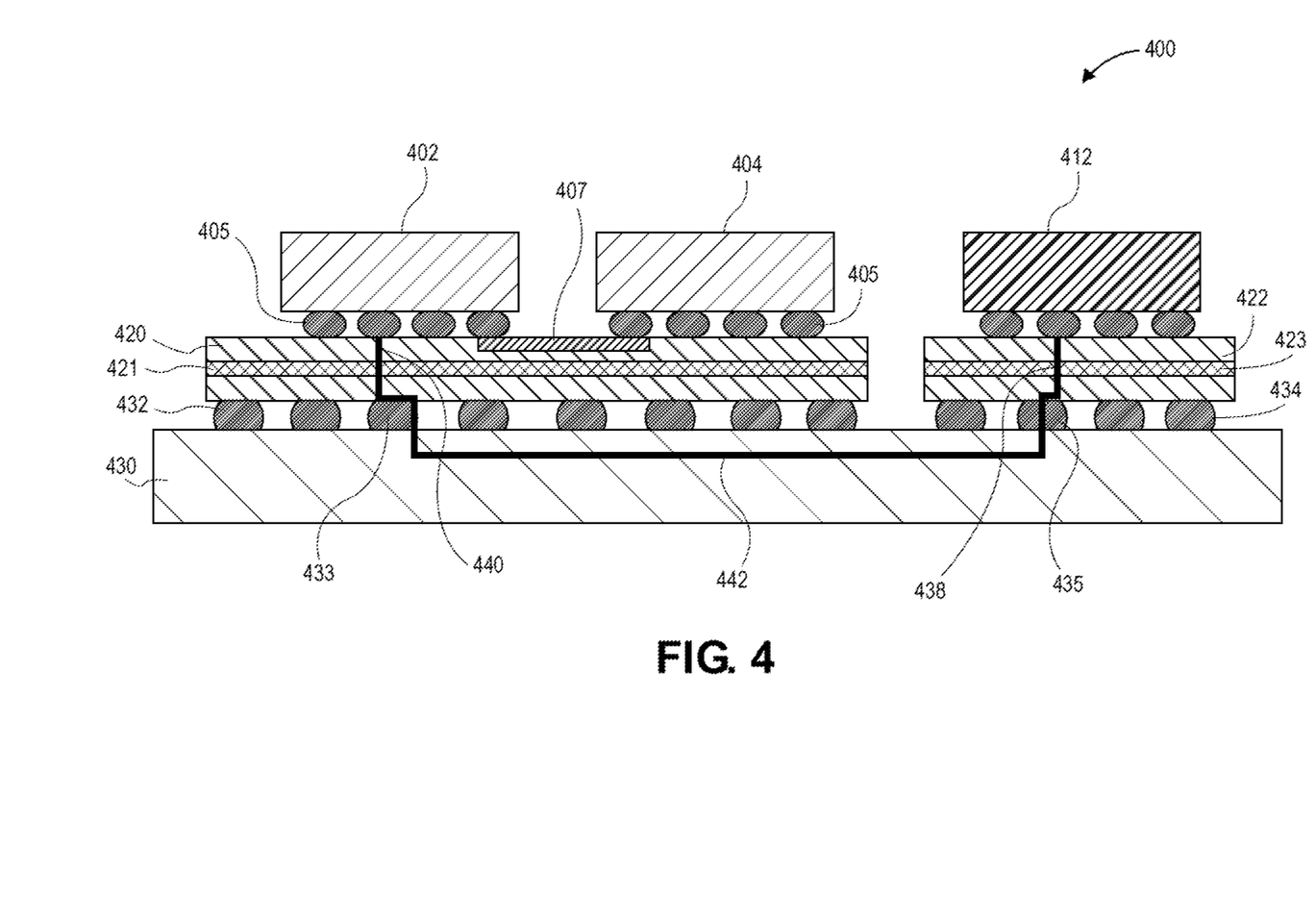
FIG. 4 illustrates a tiled package using a glass core substrate, in accordance with various embodiments.

FIG. 4 illustrates a tiled package using a glass core substrate, in accordance with various embodiments. Package 400 includes at least one compute die 402, which may be referred to as a tile, and a first storage die 404 and a second storage die 412, which may also be referred to as storage tiles. In embodiments, the compute die 402 may be coupled with the first storage die 404 using a first substrate 420. In embodiments, the first substrate 420 may be referred to as a patch. In embodiments, the first substrate 420 may include a glass core 421, which may be similar to glass cores 206, 226, 246, 266 of FIG. 2, through which conductive structures may be created.

The first storage die 404 may be electrically coupled with the compute die 402 using a bridge 407 to provide high-speed/high-bandwidth access. In embodiments, the bridge 407 may be an EMIB, an ODI, an on-package high-density interconnect or some other bridging technology. In embodiments, the bridge 407 may be partially or completely embedded within the first substrate 420. In embodiments, the first substrate 420 may be physically and/or electrically coupled with an interposer 430. In embodiments, the interposer 430 may be a printed circuit board (PCB), a multilayer organic substrate with either a glass core or a CCL core, or a silicon-based interposer. The compute die 402 and the first storage die 404 may be physically and/or electrically coupled with the first substrate 420 using bumps 405. The first substrate 420 may be physically and/or electrically coupled with the interposer 430 through BGA 432.

A second storage die 412 may be electrically and/or physically coupled with a second substrate 422. The second substrate 422 may be electrically and physically coupled to the interposer 430 using a BGA 434. The second substrate 422 includes a glass core 423, which may be similar to glass core 421. In embodiments, the compute die 402 may communicate with the first storage die 404 using the bridge 407. The compute die 402 may electrically couple with the second storage die 412 using one or more vias 440 created through the glass core of the first substrate 420. In embodiments, the via 440 may be created using techniques similar to those described with respect to FIG. 2. In embodiments, the via 440 may be plated, partially filled, or completely filled with a conductive material, such as gold, silver, silver alloy, aluminum, copper or copper alloy.

The via 440 may then be electrically coupled through a solder ball 433 of the BGA 432, through a redistribution layer (RDL) 442 in the interposer 430, and through a solder ball 435 of the BGA 434 coupled with the second substrate 422 and the second storage die 412. In embodiments, the second substrate 422 may include one or more vias 438 that may be similar to via 440 as described above. In embodiments, multiple solder balls of the BGA 434 may be coupled with one or more vias 438.

It should be appreciated that via 440 that passes through the first substrate 420 may be created using different processes. The portion of the via 440 that passes through the glass core 421, may be created using the techniques and processes described above with respect to FIG. 2. The portion of the via 440 that passes through the buildup layers of the first substrate 420 that are attached to the glass core 421 may be created using legacy through via techniques or a lithographically defined via process.

Using the vias 440 in the first substrate 420 and the vias 438 in the second substrate 422 provide a high-speed connection between the compute die 402 in the second storage die 412. In embodiments, the speed of this connection may be similar to the speed of the connection between the compute die 402 and the first storage die 404 using the bridge 407. This embodiment shows one example of how various storage dies 404, 412 may be positioned at various distances from the compute die 402, yet the speed of the connection between the compute die 402 and the various storage dies 404, 412 may be similar.

In embodiments, the second substrate 422 may contain more than one storage die, or may contain one or more die tiles and storage tiles. In embodiments, the first substrate 420 or the second substrate 422 may have conventional CCL cores.

Figure 7:
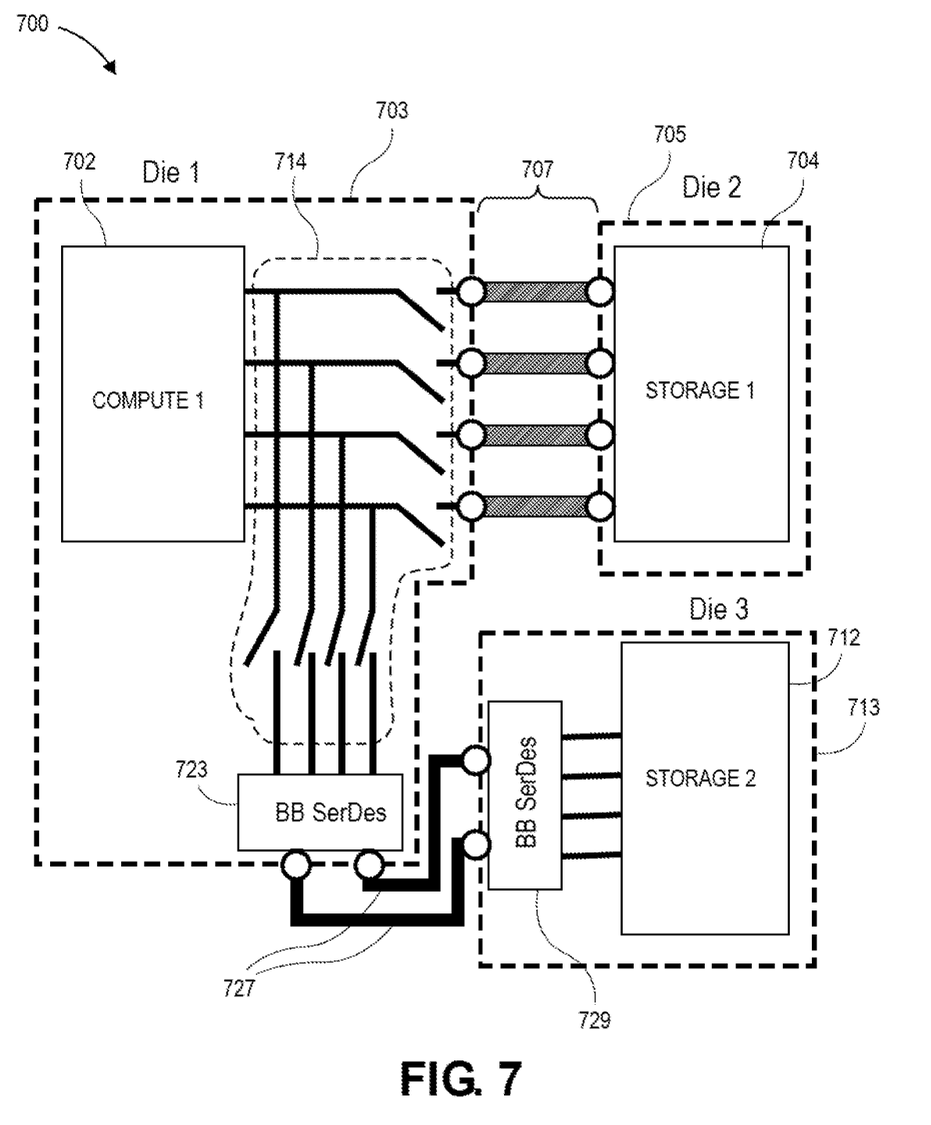
FIG. 7 illustrates a memory pool laying/sharing architecture using fast interconnects, in accordance with various embodiments.

In embodiments, the compute die 402 and the second storage die 412 may include a serializer/deserializer (SerDes), not shown, but similar to SerDes 304 of FIGS. 3A-3C, are discussed in more detail with respect to FIG. 7. In embodiments, the SerDes may either be a monolithic or a separate die. The SerDes may be designed to operate at high data rates such as 112 Gbps, 224 Gbps, 448 Gbps, etc.

Figure 5:
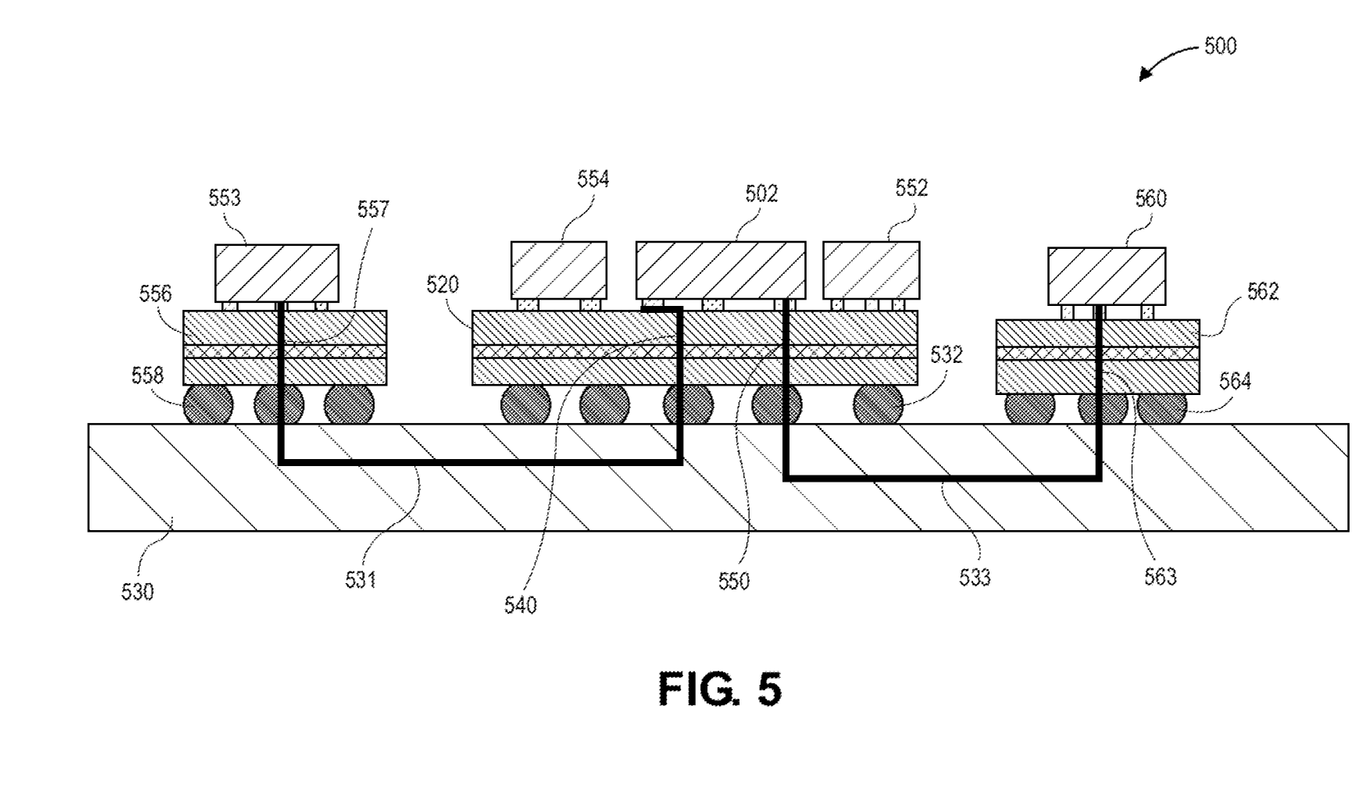
FIG. 5 illustrates a multiple tiled package, in accordance with various embodiments.

FIG. 5 illustrates a multiple tiled package, in accordance with various embodiments. Package 500, which may be similar to package 400 of FIG. 4, includes a compute die complex 502 that is coupled with a first substrate 520. In embodiments, there may be other dies or tiles 552, 554 that are also coupled with the first substrate 520. The first substrate 520 is electrically and physically coupled with the interposer 530 using a ball grid array 532.

A first storage die 553 may be coupled with a second substrate 556, and the second substrate 556 coupled with the interposer 530 using ball grid array 558. A second storage die 560 may be coupled with a third substrate 562 coupled with the interposer 530 using a ball grid array 564. In embodiments, the first substrate 520, the second substrate 556, and the third substrate 562 may include a glass core, similar to the glass cores discussed above with respect to FIGS. 2-4.

The compute die complex 502 has a high-speed connection with both the first storage die 553 and the second storage die 560, even though the first storage die 553 is coupled with a different substrate than the second storage die 560 (substrates 520, 562). A high-speed electric coupling between compute die complex 502 in the first storage die 553 includes a through via 540 through a glass core of the first substrate 520, through the BGA 532 and into an RDL layer 531 in the interposer 530. The coupling extends from the RDL layer 531 through the BGA 558, and into a through via 557 within a glass core of the second substrate 556, and then to the first storage die 553.

The compute die complex 502 has a second high-speed electric coupling with the second storage die 560, going through a second through via 550 through the BGA 532 to RDL layer 533 in the interposer 530. The coupling goes from the RDL layer 533 through the BGA 564 and into a through via 563 that is electrically coupled with the second storage die 560.

Figure 6:
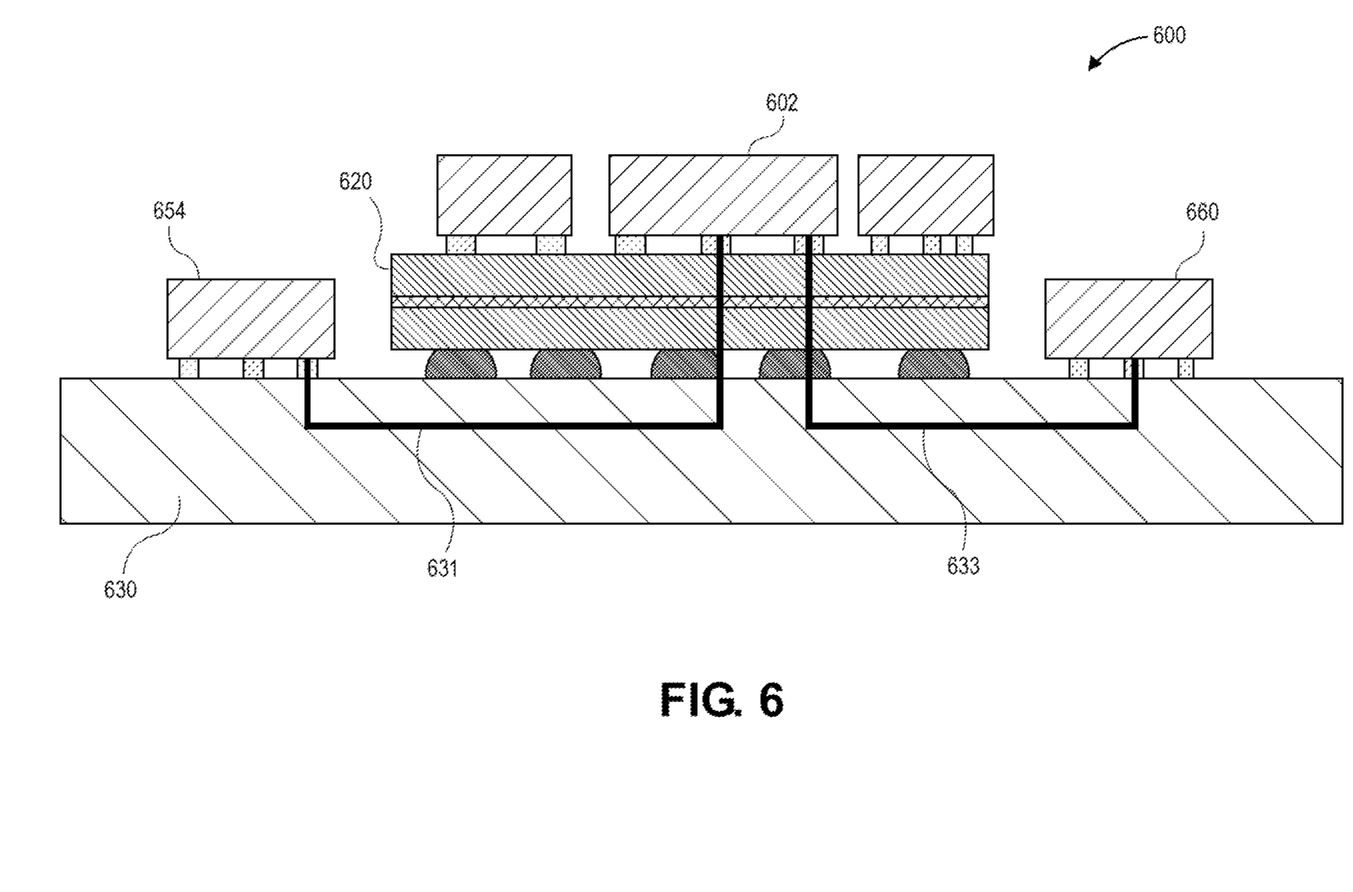
FIG. 6 illustrates a package with a storage die on an interposer, in accordance with various embodiments.

FIG. 6 illustrates a package with a storage die on an interposer, in accordance with various embodiments. Package 600 may be similar to package 500 of FIG. 5, however the first storage die 654, which may be similar to first storage die 553 of FIG. 5, is directly physically and electrically coupled with the interposer 630, which may be similar to interposer 530 of FIG. 5. In this way, the RDL 631, which may be similar to RDL 531 of FIG. 5, directly electrically couples with the first storage die 654 to provide a high speed connection between compute die complex 602, which may be similar to compute die 402 of FIG. 4, and the first storage die 654.

Similarly, the second storage die 660, which may be similar to second storage die 460 of FIG. 4, is directly physically and electrically coupled with the interposer 630. In this way, the RDL 633, which may be similar to RDL 533 of FIG. 5, directly electrically couples the compute die complex 602 with the second storage die 660. Thus, the compute die complex 602 is electrically coupled with the first storage die 654 and the second storage die 660. Note that the substrate 620, which may be similar to substrate 520 of FIG. 5, includes through glass vias (not shown) discussed above to facilitate the high-speed electrical connection.

FIG. 7 illustrates a memory pool laying/sharing architecture using fast interconnects, in accordance with various embodiments. As discussed above, as the number of dies increases on the package, there is a significant need for adding more memory closer to the compute die. Legacy implementations encounter constraints driven by interconnect losses, and interconnect densities that require, for example, that storage dies be in close proximity, for example within 5 mm or less, of a compute die.

Package 700 shows an embodiment of storage die pooling on package, where compute tile 702 on a die 703 can access different storage tiles, for example a first storage tile 704 on die 705, and storage tile 712 on die 713. In embodiments, the dies 703, 705, 713 may be coupled using a glass core substrate such as substrate 420, 422 of FIG. 4, 520, 556, 562 of FIG. 5, or 620 of FIG. 6. As shown, the dies 703, 705, 713 may be referred to as a platform.

A compute tile 702 is electrically coupled with a first storage tile 704 using a bridge 707. A bridge 707, which may be similar to bridge 407 FIG. 4, may be used because the compute tile 702 and the first storage tile 704 are physically close to each other and a short range interconnect will provide a high-speed path. In embodiments, the bridge 707 may be a EMIB, an on-package high-density interconnect or an ODI as described above.

The die 703 may include a switch circuitry 714, that may be used to electrically couple the compute tile 702 with the first storage tile 704, or to electrically couple the compute tile 702 with the second storage tile 712. In embodiments, all or part of the switch circuitry 714 may be incorporated within the compute tile 702.

When the switch circuitry 714 electrically couples the compute tile 702 with the second storage tile 712, a broadband SerDes 723 may be used to transfer data off of the first die 703 across a narrow and fast channel 727 to a broadband SerDes 729 that is coupled with the second storage tile 712 on the third die 713. In embodiments, the narrow and fast channel 727 may route through a glass core substrate with through via features, such as those shown with respect to FIGS. 3-6 above. In this way, data may be rapidly transferred between the compute tile 702 and the second storage tile 712 at a speed that may be comparable or higher than the data transferred over the bridge 707.

Figure 8:
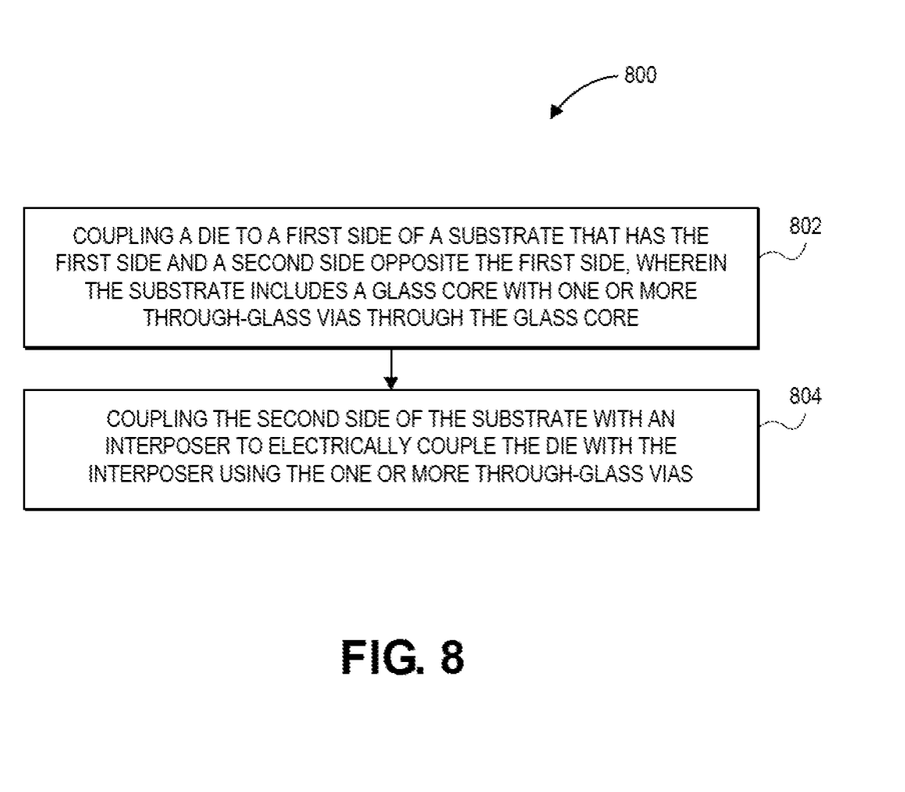
FIG. 8 illustrates an example process for creating a tiled package using a glass core substrate, in accordance with various embodiments.

FIG. 8 illustrates an example process for creating a tiled package using a glass core substrate, in accordance with various embodiments. Process 800 may be implemented using the processes, techniques, apparatus, and/or systems described with respect to FIGS. 1A-7 herein.

At block 802, the process may include coupling a die to a first side of a substrate that has the first side and a second side opposite the first side, wherein the substrate includes a glass core with one or more through-glass vias through the glass core. In embodiments, the die may be similar to dies 402, 404, 412 of FIG. 4, dies 553, 554, 502, 552, or 560 of FIG. 5, or die complex 602 of FIG. 6. The substrate may be similar to substrates 420, 422 of FIG. 4, substrates 556, 520, 562 of FIG. 5, and substrate 620 of FIG. 6. The one or more glass vias through a glass core in the substrate may be similar to vias 212, 272 of FIG. 2 prior to copper plating or copper filling.

At block 804, the process may further include coupling the second side of the substrate with an interposer to electrically couple the die with the interposer using the one or more through-glass vias. The interposer may be similar to interposer 430 of FIG. 4, interposer 530 of FIG. 5, or interposer 630 of FIG. 6.

Figure 9:
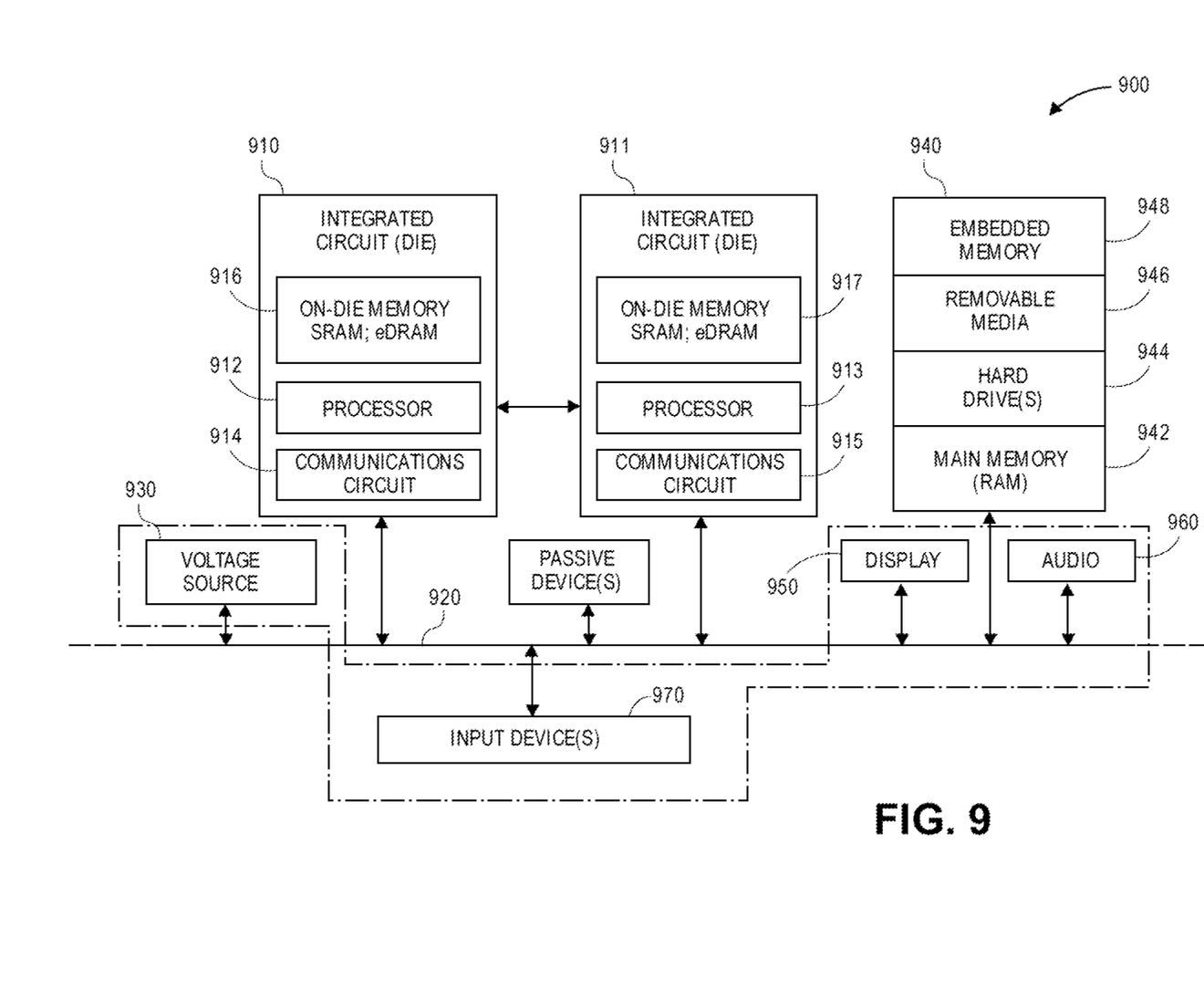
FIG. 9 schematically illustrates a computing device, in accordance with embodiments.

FIG. 9 schematically illustrates a computing device, in accordance with embodiments. The computer system 900 (also referred to as the electronic system 900) as depicted can embody all or part of a die coupling using a substrate with a glass core, according to any of the several disclosed embodiments and their equivalents as set forth in this disclosure. The computer system 900 may be a mobile device such as a netbook computer. The computer system 900 may be a mobile device such as a wireless smart phone. The computer system 900 may be a desktop computer. The computer system 900 may be a hand-held reader. The computer system 900 may be a server system. The computer system 900 may be a supercomputer or high-performance computing system.

In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 may mean any type of circuit such as, but not limited to, a microprocessor, a microcontroller, a graphics processor, a digital signal processor, or another processor. In an embodiment, the processor 912 includes, or is coupled with, all or part of a high-speed bridge, or other high-speed connection, between a package and a component, as disclosed herein. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems, or a communications circuit for servers. In an embodiment, the integrated circuit 910 includes on-die memory 916 such as static random-access memory (SRAM). In an embodiment, the integrated circuit 910 includes embedded on-die memory 916 such as embedded dynamic random-access memory (eDRAM).

In an embodiment, the integrated circuit 910 is complemented with a subsequent integrated circuit 911. Useful embodiments include a dual processor 913 and a dual communications circuit 915 and dual on-die memory 917 such as SRAM. In an embodiment, the dual integrated circuit 910 includes embedded on-die memory 917 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in a die stack, according to an embodiment.

In an embodiment, the electronic system 900 also includes a display device 950, an audio output 960. In an embodiment, the electronic system 900 includes an input device such as a controller 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

As shown herein, the integrated circuit 910 can be implemented in a number of different embodiments, including all or part of a die coupling using a substrate with a glass core, according to any of the several disclosed embodiments and their equivalents, an electronic system, a computer system, one or more methods of fabricating an integrated circuit, and one or more methods of fabricating an electronic assembly that includes a package substrate implementing all or part of a die coupling using a substrate with a glass core, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed processes used for a die coupling using a substrate with a glass core and their equivalents. A foundation substrate may be included, as represented by the dashed line of FIG. 9. Passive devices may also be included, as is also depicted in FIG. 9.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a package, comprising: a die coupled with a first side of a substrate, the substrate with a second side opposite the first side, the substrate including a glass core; the second side of the substrate coupled with an interposer; and wherein the substrate electrically couples the first die with the interposer using one or more through glass structures through the glass core of the substrate.

Example 2 includes the package of example 1, wherein the through glass structures include a selected one or more of a through glass via, or a through glass plane.

Example 3 includes the package of example 1, wherein the one or more through glass structures include a conductive material.

Example 4 includes the package of example 3, wherein the conductive material includes a selected one of copper or a copper alloy.

Example 5 includes the package of example 3, wherein the conductive material is a selected one of: plated in the one or more through glass structures, or filled in the one or more through glass structures.

Example 6 includes the package of any one of examples 1-5, wherein the die is a first die; and further comprising a second die electrically coupled with the interposer, wherein the first die is electrically coupled with the second die using the one or more through glass vias.

Example 7 includes the package of example 6, wherein the second die is not physically coupled with the substrate.

Example 8 includes the package of example 6, wherein the substrate is a first substrate; and further comprising a second substrate with a first side and a second side opposite the first side, the second substrate including a glass core, the first side of the second substrate is physically and electrically coupled with the second die; and wherein the second substrate electrically couples the second die with the interposer using one or more through glass vias through the glass core of the second substrate.

Example 9 includes the package of example 6, further comprising a third die physically and electrically coupled with the first side of the substrate; and a bridge on the first side of the substrate electrically coupling the first die and the third die.

Example 10 includes the package of example 9, wherein the bridge is a selected one of: an embedded multi-die interconnect Bridge (EMIB), an on-package high-density interconnect, or an omnidirectional interconnect (ODI).

Example 11 is a system, comprising: a first die coupled with a first side of a substrate, the first substrate with a second side opposite the first side, the substrate including a glass core; the second side of the substrate coupled with an interposer; a switch circuitry coupled with the first die, wherein the switch circuitry selectively couples the first die with a second die; and wherein the substrate electrically couples the first die with second die using one or more through glass structures through the glass core of the substrate.

Example 12 includes the system of example 11, wherein the switch circuitry is included within the first die.

Example 13 includes a system of example 11, wherein the through glass structures include a selected one or more of a through glass via, or a through glass plane.

Example 14 includes a system of example 11, wherein the one or more through glass structures include a selected one of copper or a copper alloy.

Example 15 includes the system of example 11, wherein the conductive material is a selected one or more of: plated in the one or more through glass structures, or filled in the one or more through glass structures.

Example 16 includes a system of any one of examples 11-15, further comprising a serial/deserializer electrically coupled with the switch circuitry and the interposer.

Example 17 includes a system of any one of examples 11-15, wherein the first die is a compute die and the second die is a storage die.

Example 18 is a method comprising: coupling a die to a first side of a substrate that has the first side and a second side opposite the first side, wherein the substrate includes a glass core with one or more through-glass vias through the glass core; and coupling the second side of the substrate with an interposer to electrically couple the die with the interposer using the one or more through-glass vias.

Example 19 includes the method of example 18, further comprising creating the one or more through-glass vias through the glass core by applying a laser-assisted etched glass interconnects process (LEGIT) to the glass core.

Example 20 includes a method of any one of examples 18-19, further comprising electrically coupling another die with the interposer to electrically couple the die in the other die using the through-glass vias through the glass core.

What is claimed is:

1. A package, comprising:
a die coupled with a first side of a substrate, the substrate with a second side opposite the first side, the substrate including a glass core;
the second side of the substrate coupled with an interposer; and
wherein the substrate electrically couples the first die with the interposer using one or more through glass structures through the glass core of the substrate.

2. The package of claim 1, wherein the through glass structures include a selected one or more of a through glass via, or a through glass plane.

3. The package of claim 1, wherein the one or more through glass structures include a conductive material.

4. The package of claim 3, wherein the conductive material includes a selected one of copper or a copper alloy.

5. The package of claim 3, wherein the conductive material is a selected one of: plated in the one or more through glass structures, or filled in the one or more through glass structures.

6. The package of claim 1, wherein the die is a first die; and
further comprising a second die electrically coupled with the interposer, wherein the first die is electrically coupled with the second die using the one or more through glass vias.

7. The package of claim 6, wherein the second die is not physically coupled with the substrate.

8. The package of claim 6, wherein the substrate is a first substrate; and further comprising a second substrate with a first side and a second side opposite the first side, the second substrate including a glass core, the first side of the second substrate is physically and electrically coupled with the second die; and wherein the second substrate electrically couples the second die with the interposer using one or more through glass vias through the glass core of the second substrate.

9. The package of claim 6, further comprising a third die physically and electrically coupled with the first side of the substrate; and a bridge on the first side of the substrate electrically coupling the first die and the third die.

10. The package of claim 9, wherein the bridge is a selected one of: an embedded multi-die interconnect Bridge (EMIB), an on-package high-density interconnect, or an omnidirectional interconnect (ODI).

11. A system, comprising:
a first die coupled with a first side of a substrate, the first substrate with a second side opposite the first side, the substrate including a glass core;
the second side of the substrate coupled with an interposer;
a switch circuitry coupled with the first die, wherein the switch circuitry selectively couples the first die with a second die; and
wherein the substrate electrically couples the first die with second die using one or more through glass structures through the glass core of the substrate.

12. The system of claim 11, wherein the switch circuitry is included within the first die.

13. The system of claim 11, wherein the through glass structures include a selected one or more of a through glass via, or a through glass plane.

14. The system of claim 11, wherein the one or more through glass structures include a selected one of copper or a copper alloy.

15. The system of claim 11, wherein the conductive material is a selected one or more of: plated in the one or more through glass structures, or filled in the one or more through glass structures.

16. The system of claim 11, further comprising a serial/deserializer electrically coupled with the switch circuitry and the interposer.

17. The system of claim 11, wherein the first die is a compute die and the second die is a storage die.

* * * * *